(12) United States Patent
Lips et al.

(10) Patent No.: US 8,571,630 B2
(45) Date of Patent: Oct. 29, 2013

(54) TRANSMISSION LINE FOR RF SIGNALS WITHOUT MATCHING NETWORKS

(75) Inventors: Oliver Lips, Hamburg (DE); Bernd David, Huettblek (DE); Sascha Krueger, Hamburg (DE); Steffen Weiss, Hamburg (DE); Daniel Wirtz, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 992 days.

(21) Appl. No.: 12/524,001

(22) PCT Filed: Jan. 24, 2008

(86) PCT No.: PCT/IB2008/050252
§ 371 (c)(1),
(2), (4) Date: Dec. 8, 2009

(87) PCT Pub. No.: WO2008/093262
PCT Pub. Date: Aug. 7, 2008

(65) Prior Publication Data
US 2010/0094123 A1    Apr. 15, 2010

(30) Foreign Application Priority Data
Jan. 30, 2007 (EP) .................................... 07101384

(51) Int. Cl.
*A61B 5/05* (2006.01)
(52) U.S. Cl.
USPC ............. 600/410; 600/407; 600/41; 600/423; 324/322; 29/828; 333/24 R
(58) Field of Classification Search
None
See application file for complete search history.

(56) References Cited

U.S. PATENT DOCUMENTS

| | | | |
|---|---|---|---|
| 6,284,971 B1 * | 9/2001 | Atalar et al. | 174/36 |
| 6,852,416 B2 | 2/2005 | Zhang et al. | |
| 2002/0013525 A1 | 1/2002 | Scott | |
| 2002/0109503 A1 | 8/2002 | Kestler et al. | |
| 2005/0218897 A1 * | 10/2005 | Schulz et al. | 324/322 |

FOREIGN PATENT DOCUMENTS

| WO | 2005103748 A1 | 11/2005 |
|---|---|---|
| WO | 2006003566 A1 | 1/2006 |
| WO | 2006067703 A2 | 6/2006 |

OTHER PUBLICATIONS

Bartels, L. W., et al.; Endovascular interventional magnetic resonance imaging; 2003; Phys. Med. Biol.; 48:R37-R64.

(Continued)

*Primary Examiner* — Unsu Jung
*Assistant Examiner* — Joseph M Santos Rodriguez

(57) ABSTRACT

An electrically conductive transmission line for transmitting RF signals, in particular for transmitting MR signals between a transmission and/or receiving coil and a transmitting and/or receiving unit, by which separate known matching networks can be avoided or reduced. A transmission line is proposed comprising a plurality of lead segments coupled by transformers having a transformer impedance $Z_L$ placed between two neighboring lead segments, wherein for power matching of the two transformers placed at opposite ends of a lead segment, the lead segment has a lead segment impedance $Z_0$ or a dielectric constant $\in_r$, and wherein the lead segment has a short length l. Thus, the lead segments themselves provide the matching of the transformers, and separate matching circuits are no longer needed.

10 Claims, 2 Drawing Sheets

(56) References Cited

OTHER PUBLICATIONS

Krueger, S., et al.; RF-safe intravascular imaging using a self-visualizing transformer line; 2007; Proc. Int'l. Soc. Mag. Reson. Med.; 15:491.

Krueger, S., et al.; MR-visible and RF-safe low profile transmission line for active devices; 2007; Proc. Int'l. Soc. Mag. Reson. Med.; 15:1105.

Weiss, S., et al.; Evaluation of a Transformer based Transmission Line for improved RF Safety of devices at 3T; 2006; Proc. Int'l. Soc. Mag. Reson. Med.; 14:1406.

Xiong, C., et al.; Polyvinyl-butyral/lead zirconate titanates composites with high dielectric constant and low dielectric loss; 2006; Scripta Materialia; 55(9)835-837.

Huang, C., et al.; High-dielectric-constant all-polymer percolative composites; 2003; Appl. Phys. Lett.; 82(20)3502.

\* cited by examiner

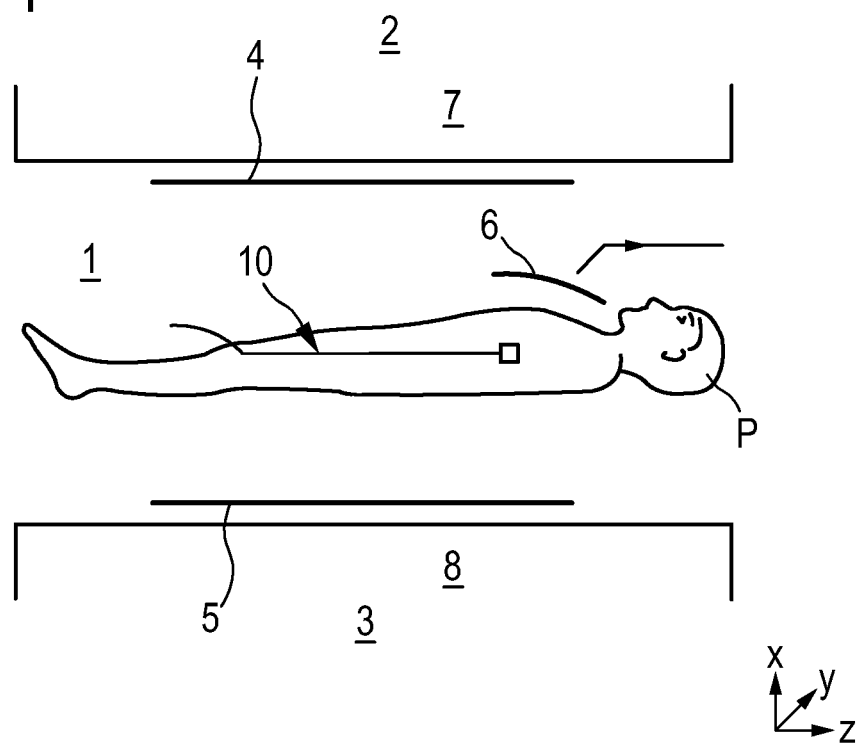
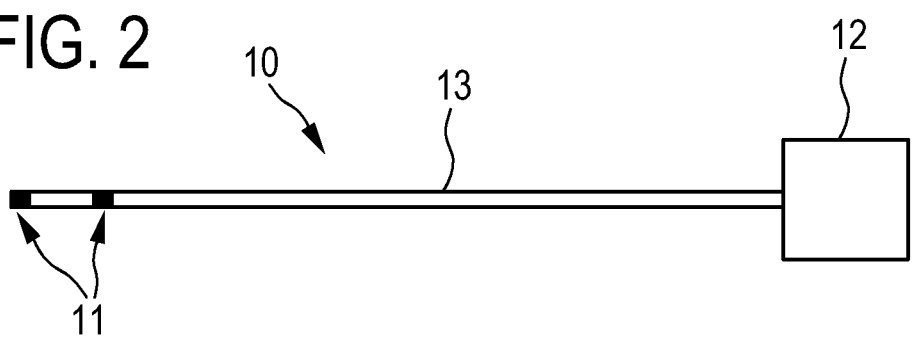

TRANSMISSION LINE FOR RF SIGNALS WITHOUT MATCHING NETWORKS

FIELD OF THE INVENTION

The present invention relates to an electrically conductive transmission line for transmitting RF signals, in particular for transmitting MR signals between a transmission and/or receiving coil and a transmitting and/or receiving unit.

The present invention relates further to an electrical accessory device or auxiliary equipment, in particular a catheter, comprising such a transmission line.

Still further the present invention relates to a magnetic resonance imaging system.

BACKGROUND OF THE INVENTION

The use of catheters containing conducting elements in a Magnetic Resonance Imaging (MRI) environment poses severe safety problems, mainly due to RF heating effects. This prevents the practical use of many transcatheter interventional instruments and thus hampers interventional procedures under MRI guidance despite clear advantages of this imaging method like strong soft tissue contrast and the absence of ionizing radiation.

For a reliably robust visualization of the catheter in the MR image it is necessary to connect a receiving antenna (e.g. a small coil or a loopless antenna) at its tip with the receiver of the MR scanner. One way to realize this connection without causing dangerous RF heating is to implement transformers in the transmission line as described, for instance, in WO 2006/003566. The transformers block induced common mode currents, while differential mode currents like the MR signal can pass.

A way of adjusting the transformers using additional lumped element matching networks, comprising at least one T-, L- and/or π-quadrupole, which each comprise at least two impedance elements in the form of a capacitor and/or an inductivity, is described in WO 2005/103748.

For optimal signal transmission it is necessary to match the output impedance of any transformer in the transmission line to its complex conjugated value (power matching). This can be accomplished by using the matching networks as described in WO 2005/103748. In particular a network is used to match the output of the transformer to a transmission line having typically $Z_0=50\Omega$ impedance. Then this line is matched at its end using another network to the input of the next transformer. The matching networks contain lumped elements, normally capacitors.

On the one hand side it is not easy to solder these matching networks due to the small size, which is required to fit into a catheter. On the other hand side every additional soldering joint is a possible source of malfunction, especially in a flexible catheter, where stress and torque can occur.

SUMMARY OF THE INVENTION

It is an object of the present invention to provide an electrically conductive transmission line for transmitting RF signals, in particular for transmitting MR signals between a transmission and/or receiving coil and a transmitting and/or receiving unit, avoiding or at least reducing matching networks.

It is another object to provide a corresponding electrical accessory device or auxiliary equipment, in particular a catheter, and a corresponding MRI system.

In a first aspect of the present invention an electrically conductive transmission line is presented that comprises a plurality of lead segments coupled only by transformers having a transformer impedance $Z_L$ placed between two neighbouring lead segments, wherein for power matching of the two transformers placed at opposite ends of a lead segment said lead segment has a low lead segment impedance $Z_0$ and/or a high dielectric constant $\in_r$ and wherein the length l of said lead segment is determined by $$l = \frac{1}{\beta}\arctan\left(\frac{-2\,\text{Im}(Z_L)}{\left(Z_0 - \frac{|Z_L|^2}{Z_0}\right)}\right)$$

where $\beta = 2\pi/\lambda$, $\lambda = \lambda_0/\sqrt{\in_r}$ and $\lambda_0$ is the wavelength of the magnetic resonance signals in vacuum.

In a further aspect of the present invention an electrical accessory device or auxiliary equipment, in particular a catheter, is presented comprising a transmission line according to the present invention, in particular for connecting the electrical accessory device or auxiliary equipment with a connection unit in a magnetic resonance imaging system.

In still a further aspect of the present invention a magnetic resonance imaging system is presented comprising a transmission line according to the present invention and/or at least one electrical accessory device or auxiliary equipment according to the present invention.

Preferred embodiments of the invention are defined in the dependent claims. It shall be understood that the electrical accessory device or auxiliary equipment of claim 6 and the MRI system of claim 7 have similar and/or identical preferred embodiments as defined in the dependent claims.

The present invention is based on the idea to choose appropriate lead segments of the transmission line. Since no lumped elements or matching networks are used for power matching of the transformers, which is solely achieved by the lead segments itself, it is also possible to realize a much lower profile of the transmission line, which eases the integration into a catheter.

The generation of a common mode on the cable sheathing can thus be prevented. Such a common mode would, e.g. in an MR scanner, cause large electric fields at the tip of electrical cables which would heat or even burn the surrounding tissue. On transmission lines having a short length the external field can not or only to a small extent excite the common mode.

According to a preferred embodiment the lead segments have a dielectric constant $\in_r$ having a value of at least 3, in particular of at least 10. The dielectric constant $\in_r$ of a typical coaxial cable (50Ω) has a value in the range of 2 to 3. Materials having higher values for the dielectric constant $\in_r$ are available, and appropriate materials need to be selected according to the desired application of the cable, e.g. the required rigidity and flexibility. As an example polymeric composites, e.g. Polyvinyl-butyral/lead zirconate titanates composites (as, for instance, described in C. Xiong et al., Polyvinyl-butyral/lead zirconate titanates composites with high dielectric constant and low dielectric loss, Scripta Materialia 55(9), 835-837, 2006), may be used. Other possible materials are a combination of conductive polyaniline particles within a poly(vinylidene fluoride-trifluoroethylene-chlorotrifluoroethylene) terpolymer matrix (as described in C. Huang et al., High-dielectric-constant all-polymer percolative composites, Appl. Phys. Lett. 82(20) 3502 (2003)) or composites of metallophtalaocyanine oligomer and poly(vinylidene-trifluoroethylene) copolymer (as described in U.S. Pat. No. 6,852,416). It is also principally possible to stabilize a coaxial cable structurally and to fill the space between the conductors with an appropriate liquid, e.g. glycerol, having a high value of $\in_r$.

According to a further embodiment of the invention the lead segments have a lead segment impedance $Z_0$ having a value below 50Ω, in particular below 10Ω. The lead segment impedance should be as low as it is possible to manufacture. With a 50Ω coaxial cable the diameter ratio of the outer conductor to the inner conductor is approximately 5.2, while for a 10Ω coaxial cable the diameter ratio is approximately 1.3, i.e. by reducing said ratio the lead segment impedance can be reduced. For instance, triaxial cables are available having an impedance of 9Ω between the second and third conductor (the central conductor is not used in this case).

Preferably, the lead segments have a length that is much smaller than $\lambda/2$ of its common mode. This is generally possible due to the use of the transformers connecting the lead segments and prevents the generation of the common mode and of resonances, i.e. the transmission line is thus MR safe.

The lead segments comprise preferably parallel wires, in particular striplines, or coaxial cables.

It is advantageous that the lead segments, in particular the geometry, materials and coating of the lead segments, are selected such that a magnetic field generated by a standing wave formed during operation in the transmission line is not shielded. The magnetic field formed by such a standing wave in the vicinity around the transmission line can thus be measured and is visible in the images taken by an MRI system which is a preferred feature for many medical applications.

BRIEF DESCRIPTION OF THE DRAWINGS

These and other aspects of the invention will be apparent from and elucidated with reference to the embodiment(s) described hereinafter. In the following drawings FIG. 1 shows a diagrammatic side elevation of an MR imaging apparatus;

FIG. 2 shows a diagrammatic representation of an accessory device according to the invention;

DETAILED DESCRIPTION OF THE INVENTION

Figure 3:
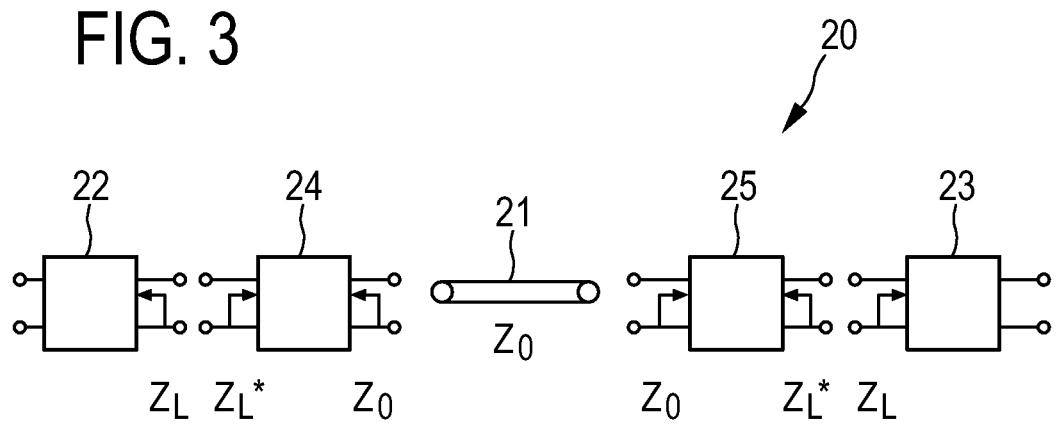
FIG. 3 shows an embodiment of a known RF transmission line.

FIG. 1 exemplarily shows components of an open MR imaging apparatus which are of essential importance for the generation and reception of magnetic fields in an examination zone 1. Above and underneath the examination zone 1 there are provided respective magnet systems 2, 3 which generate an essentially uniform main magnetic field ($B_0$ field for magnetizing the object to be examined, that is, for aligning the nuclear spins) whose magnetic flux density (magnetic induction) may be in the order of magnitude of between some tenths of Tesla to some Tesla. The main magnetic field essentially extends through a patient P in a direction perpendicular to the longitudinal axis of the patient (that is, in the x direction).

Planar or at least approximately planar RF conductor structures (resonators) in the form of RF transmission coils 4 ("body coils") are provided for generating RF pulses ($B_1$ field) of the MR frequency whereby the nuclear spins are excited in the tissue to be examined, said RF transmission coils 4 being arranged on the respective magnet systems 2 and/or 3. RF receiving coils 5 are provided for receiving subsequent relaxation events in the tissue; these coils 5 may also be formed by RF conductor structures (resonators) provided on at least one of the magnet systems 2, 3. Alternatively, one common RF resonator can also be used for transmission and reception if it is suitably switched over, or the two RF resonators 4, 5 can serve for the alternating transmission and reception in common.

Furthermore, for the spatial discrimination and resolution of the relaxation signals emanating from the tissue of a patient P (localization of the excited states) there are also provided a plurality of gradient magnetic field coils 7, 8 whereby three gradient magnetic fields are generated which extend in the direction of the x axis. Accordingly, a first gradient magnetic field varies essentially linearly in the direction of the x axis, while a second gradient magnetic field varies essentially linearly in the direction of the y axis, and a third gradient magnetic field varies essentially linearly in the direction of the z axis.

Electrical accessory devices or auxiliary equipments are required for certain examinations. Such devices are, for example, RF surface coils 6 which are used in addition to or as an alternative for the planar RF receiving body coils 5 and which are arranged as RF receiving coils directly on the patient P or the zone to be examined. These RF surface coils 6 are generally constructed as flexible pads or sleeves.

Furthermore, in order to carry out the treatment of the patient P or to extract a tissue sample or to determine tissue parameters, use is often made of a catheter 10 which is introduced into the patient and whose position is to be visualized on a display screen. Various active methods and passive methods (WO 99/19739) as well as global and local detection or tracking strategies are known for this purpose (Bartels and Bakker in "Endovascular interventional magnetic resonance imaging", Institute of Physics Publishing, Phys. Med. Biol. 48 (2003) R37-R64).

FIG. 2 shows a diagrammatic representation of such an accessory device in the form of a catheter 10. On the tip of the catheter (or in a location at a slight distance therefrom) there could be arranged a transmission and/or receiving unit 11, for example, in the form of a microchip on which the necessary components like a coil (and possibly also sensors) are realized, or the tip is provided with sensors or other means according to the prior art. At the end of the catheter 10 which is situated outside the patient P a connection unit 12 is provided in the form of a power supply unit and/or a receiving device and/or a control device and/or a switching unit (not shown) which is connected, via a conductive link (connection lead) or transmission line 13 which is guided through the catheter, to the transmission and/or receiving unit 11 and via which the transmission and/or receiving unit 11 is activated and possibly the measuring values and data from sensors or other components are transmitted.

In the case of an accessory device in the form of RF surface coils 6, such coils are also connected, via a conductive link (connection lead) or transmission line 13, to a corresponding connection unit 12 (power supply, receiving/transmitting device and/or control device).

The field generated by the RF coil system induces RF common mode currents in the transmission line 13. According to the invention, a safe conductive link (connection lead) or transmission line 13 is provided which is separated into lead segments connected by miniaturized transformers which are matched to each other by the lead segments itselfs and without any additional matching circuits as, for instance, described in WO 2005/103748.

FIG. 3 shows an embodiment of a portion of such a known RF transmission line 20. Said transmission line generally comprises lead segments 21, transformers 22, 23 and matching circuits 24, 25 for matching the output impedance of any transformer 22, 23 in the transmission line to its complex conjugated value (power matching) for optimal signal transmission. This can be accomplished by using T, L and/or it shaped matching networks (as e.g. shown in WO 2005/103748, for instance FIG. 3). In this way the output of the transformers 22, 23 is matched to the transmission line (lead segment 21) having typically $Z_0=50\Omega$ impedance. Then this line is matched at its end using another network to the input of the next transformer.

Figure 4:
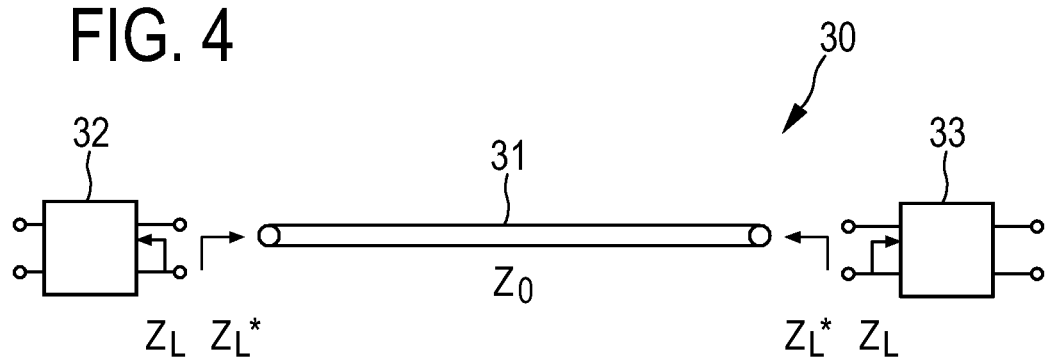
FIG. 4 shows an embodiment of an RF transmission line according to the invention.

FIG. 4 shows an embodiment of a portion of an RF transmission line 30 according to the present invention which avoids such matching networks by choosing appropriate transmission lines comprising only transformers 32, 33 and lead segments 31. Since no lumped elements are used as in those matching circuits it is also possible to realize a much lower profile of the transmission line, which eases the integration into a catheter.

It is possible to match the transformers without dedicated matching networks using the transformation properties of transmission lines. It is known that a (lossless) transmission line of the length l transforms a load $Z_L$ at its end to the input impedance $$Z_{input} = Z_0 \frac{Z_L + iZ_0\tan\beta l}{Z_0 + iZ_L\tan\beta l},$$

where $Z_0$ denotes the impedance of the transmission line. $\beta$ is given by $2\pi/\lambda$, with $\lambda$ being the (differential mode) wavelength inside the cable, which depends on the dielectric constant of the cable:

$$\lambda = \frac{\lambda_0}{\sqrt{\varepsilon_r}}.$$

For optimal power transmission a generator should be terminated with its complex conjugated input impedance. This means for the (identical) transformers in the safe transmission line:

$$Z_{input} = Z_L^*,$$

which leads to the condition:

$$\tan\beta l = \frac{Z_L^* - Z_L}{i\left(Z_0 - \frac{Z_L Z_L^*}{Z_0}\right)} = \frac{-2\,\text{Im}(Z_L)}{\left(Z_0 - \frac{|Z_L|^2}{Z_0}\right)}. \quad (1)$$

This can easily be fulfilled adjusting l, $\lambda$, (via $\varepsilon_r$) and/or $Z_0$. The cable impedance is given by the cable geometry, e.g.: parallel wires:

$$Z_0 = \frac{120\Omega}{\sqrt{\varepsilon_r}}\ln\frac{2b}{a}$$

(b=distance, a=wire diameter, b>>a)

coaxial cable:

$$Z_0 = \frac{60\Omega}{\sqrt{\varepsilon_r}}\ln\frac{D}{d}$$

(d=outer diameter inner conductor, D=inner diameter outer conductor)

A limiting condition for the RF safety is the resulting length l of the cables between the transformers. It has to be much shorter than $\lambda/2$ of the common mode, which is mainly determined by the dielectric properties of the material surrounding the cable. The most convenient solution would be a cable having a high dielectric constant, so that the differential mode wavelength becomes rather short, which also means that the required lengths l calculated via equation (1) stay short compared to the common mode resonance.

Since in the proposed approach the transmission line itself becomes part of a resonating structure, it becomes visible in the MR image if parallel wires are used. Also coaxial cables, which are not perfectly concentric and not ideally shielded, are visible. This additionally helps in the localization of the catheter. On the other hand the same resonance effect sets a requirement for the losses of the cable. Transmission lines having very small damping must be used to avoid strong attenuation of the signal.

Furthermore, the approach of matching the transformers using transmission lines can be combined with additional lumped elements. It is possible to add e.g. only one parallel capacitor to each side of the transformer in combination with the proposed transmission line matching.

Knowing the impedance $Z_L$ of the transformers, transmission lines can be directly calculated, which perform the power matching between them. There are principally three degrees of freedom: The length l, the differential mode wavelength $\lambda$ determined by $\varepsilon_r$ and the impedance $Z_0$ (determined by $\varepsilon_r$ and the geometry). It turns out, that low $Z_0$ and high $\varepsilon_r$ are favourable, since they generally keep the required cable length short. This is important for the RF safety of the whole assembly. Knowing $Z_0$ and $\varepsilon_r$ the transmission line can be cut to the required length l.

Principally either coaxial cables or two wire lines can be used to connect the transformers. If the transformers in the safe transmission line can be built reproducibly, it is possible to produce the transmission lines and the transformers as one piece without any additional elements.

The invention can be used in conjunction with the safe transmission line as described in WO 2006/003566. The main application is to realize electrical links in an MR scanner (e.g. to receiving elements on interventional devices) without causing dangerous RF heating.

In the following the effect of the invention shall be shown illustrating an example. An available micro coaxial cable has an outer diameter of 0.5 mm and losses of about 1 dB/m. To achieve the matching for the chosen transformers, cables of $0.39\lambda$ were necessary. Since the cable has a dielectric constant $\varepsilon_r$ of 2.1, the resulting cable length for 63.87 MHz was 1.25 m, i.e. rather long. Assuming that it is possible to increase the value of $\varepsilon_r$ to 20, the impedance of the cable will be reduced to approximately $16\Omega$ without changing it geometry. Using this kind of cable an electrical length of $0.22\lambda$ is necessary for the matching, which in turn results in a cable length of 23 cm. This can be considered MR safe and also the losses will be reduced significantly. Alternatively, the impedance of the cable can also be altered by changing its geometry only, i.e. by modifying the radii of the inner and outer conductor. If the impedance is changed in this way to 10Ω, cable segments of 0.15λ electrical length are necessary for the matching.

The invention is based on the insight that in the case of transformers connecting lead segments of the transmission line it is possible to fulfill the power matching by any transmission line by adjusting its length. This principally does not even necessitate special cables. The resulting length has, for applications in MR, to be MR safe, which requires a high dielectric constant $\in_r$ and/or a low cable impedance.

A further insight is that in the case of cable matching the resonating currents (the standing wave mentioned above) of the transformer are present in the transmission line as well with the effect, that the entire transmission line can be visualized in the MR image, which will be highly appreciated by an interventional radiologist. If the known matching circuits are used for matching, no such standing waves are present on the transmission line since it is matched.

With the invention further important improvements can be achieved since the production of the transmission line without matching circuits is much easier and the transmission line can be much smaller, which is a large advantage considering the use inside catheters. Also the risk of malfunction is reduced significantly.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. An electrically conductive transmission line for transmitting magnetic resonance RF signals between a transmission or receiving coil and a transmitting or receiving unit, comprising a plurality of lead segments coupled only by transformers having a transformer impedance $Z_L$ placed between two neighbouring lead segments, wherein for power matching of the two transformers placed at opposite ends of a lead segment, the lead segment has a lead segment impedance $Z_0$ or a dielectric constant $\in_r$, and wherein the length l of the lead segment is determined by $$l = \frac{1}{\beta}\arctan\left(\frac{-2\ \text{Im}(Z_L)}{\left(Z_0 - \frac{|Z_L|^2}{Z_0}\right)}\right)$$

where $$\beta = 2\pi/\lambda, \lambda = \frac{\lambda_0}{\sqrt{\varepsilon_r}}$$

and $\lambda_0$ is the wavelength of the magnetic resonance signals in a vacuum.

2. The transmission line according to claim 1, wherein the lead segments have a dielectric constant $\in_r$ having a value of at least 3.

3. The transmission line according to claim 1, wherein the lead segments have a lead segment impedance $Z_0$ having a value below 50Ω.

4. The transmission line according to claim 1, wherein the lead segments have a length that is smaller than λ/2 of its common mode.

5. The transmission line according to claim 1, wherein the lead segments comprise parallel wires, wherein the parallel wires include one of striplines, or coaxial cables.

6. The transmission line according to claim 1, wherein one of a geometry and materials of the lead segments, are selected such that a magnetic field generated by a standing wave formed during operation in the transmission line is not shielded.

7. An electrical accessory device or auxiliary equipment, comprising a transmission line according to claim 1.

8. A magnetic resonance imaging system comprising a transmission line according to claim 1 and at least one electrical accessory device or auxiliary equipment according to claim 7.

9. The transmission line according to claim 1, wherein the lead segments have a dielectric constant $\in_r$ having a value of at least 10.

10. The transmission line according to claim 1, wherein the lead segments have a lead segment impedance $Z_0$ having a value below 10Ω.

* * * * *